(12) United States Patent
Goida

(10) Patent No.: US 10,800,651 B2
(45) Date of Patent: Oct. 13, 2020

(54) LOW STRESS INTEGRATED DEVICE PACKAGES

(71) Applicant: ANALOG DEVICES, INC., Norwood, MA (US)

(72) Inventor: Thomas M. Goida, Windham, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/496,987

(22) Filed: Apr. 25, 2017

(65) Prior Publication Data

US 2017/0320725 A1    Nov. 9, 2017

Related U.S. Application Data

(60) Provisional application No. 62/332,950, filed on May 6, 2016.

(51) Int. Cl.
*G01L 9/00*     (2006.01)
*G01C 5/06*     (2006.01)
(Continued)

(52) U.S. Cl.
CPC .......... *B81B 7/0051* (2013.01); *B81B 7/0006* (2013.01); *B81B 7/0048* (2013.01);
(Continued)

(58) Field of Classification Search
CPC ... B81B 7/0051; B81B 7/0074; B81B 7/0006; B81B 2201/0235; B81B 2201/0242; B81B 7/0041; B81B 7/0045; B81B 7/0048; B81B 7/0054; B81B 7/0058; B81B 2203/0315; H01L 23/50; H01L 23/49; H01L 23/20; H01L 23/24; H01L 23/538; H01L 25/043; H01L 2924/181; H01L 2224/8592; H01L 2224/49175; H01L 23/562; H01L 23/041;
(Continued)

(56) References Cited

U.S. PATENT DOCUMENTS 8,035,125 B2 * 10/2011 Abe .................. H01L 33/54
                                                      257/99
8,748,231 B2    6/2014 Logan et al.
(Continued)

FOREIGN PATENT DOCUMENTS

CN    104515638 A    4/2015
CN    105277172 A    1/2016

OTHER PUBLICATIONS

First Office Action in related Chinese Application No. 201710309929.6 dated Sep. 19, 2018.
(Continued)

*Primary Examiner* — Nelson Garces
(74) *Attorney, Agent, or Firm* — Knobbe, Martens, Olson & Bear, LLP

(57) ABSTRACT

An integrated device package is disclosed. The integrated device package can include a packaging structure defining a cavity. An integrated device die can be disposed at least partially within the cavity. A gel can be disposed within the cavity surrounding the integrated device. A portion of the gel can be disposed between a lower surface of the integrated device die and an upper surface of the packaging structure within the cavity.

20 Claims, 8 Drawing Sheets

(51) Int. Cl.
*H01L 29/84* (2006.01)
*B81B 7/00* (2006.01)
*H01L 23/24* (2006.01)
*H01L 23/20* (2006.01)
*H01L 23/49* (2006.01)
*H01L 23/538* (2006.01)
*H01L 23/50* (2006.01)
*H01L 23/04* (2006.01)
*H01L 23/00* (2006.01)
*G01L 19/14* (2006.01)
*H01L 23/498* (2006.01)
*H01L 23/31* (2006.01)

(52) U.S. Cl.
CPC .............. *B81B 7/0074* (2013.01); *G01C 5/06* (2013.01); *G01L 9/0042* (2013.01); *G01L 9/0054* (2013.01); *G01L 19/145* (2013.01); *G01L 19/147* (2013.01); *H01L 23/041* (2013.01); *H01L 23/20* (2013.01); *H01L 23/24* (2013.01); *H01L 23/49* (2013.01); *H01L 23/50* (2013.01); *H01L 23/538* (2013.01); *H01L 23/562* (2013.01); *H01L 29/84* (2013.01); *B81B 2201/0235* (2013.01); *B81B 2201/0242* (2013.01); *H01L 23/3121* (2013.01); *H01L 23/49861* (2013.01); *H01L 2224/48145* (2013.01); *H01L 2224/48247* (2013.01); *H01L 2224/48465* (2013.01); *H01L 2224/73265* (2013.01); *H01L 2924/16195* (2013.01); *H01L 2924/181* (2013.01)

(58) Field of Classification Search
CPC ......... B81C 1/0023; G01L 19/141–147; G01L 9/0042; G01L 9/0054; G01L 19/145; G01L 19/147; G01L 19/02; G01C 5/06

USPC ...................................................... 257/687
See application file for complete search history.

(56) References Cited

U.S. PATENT DOCUMENTS

| | | | | |
|---|---|---|---|---|
| 2004/0188782 | A1* | 9/2004 | Fujii | B81B 7/0058 257/415 |
| 2009/0045498 | A1* | 2/2009 | Braden | H01L 23/24 257/687 |
| 2013/0193530 | A1 | 8/2013 | Ehrenpfordt | |
| 2014/0027867 | A1* | 1/2014 | Goida | H01L 23/5389 257/416 |
| 2014/0291781 | A1* | 10/2014 | Shaw | H01L 29/84 257/415 |
| 2014/0374925 | A1 | 12/2014 | Logan et al. | |
| 2015/0090041 | A1* | 4/2015 | Imai | G01L 19/146 73/723 |
| 2015/0369681 | A1* | 12/2015 | Imai | G01C 5/06 73/727 |
| 2017/0089789 | A1* | 3/2017 | Kanemoto | G01C 5/06 |
| 2017/0250118 | A1* | 8/2017 | Yotsuya | G01L 19/0654 |

OTHER PUBLICATIONS

Office Action issued in Chinese application No. 201710309929.6 dated Aug. 16, 2019.
Office Action issued in Chinese application No. 201710309929.6 dated Apr. 20, 2020.

* cited by examiner

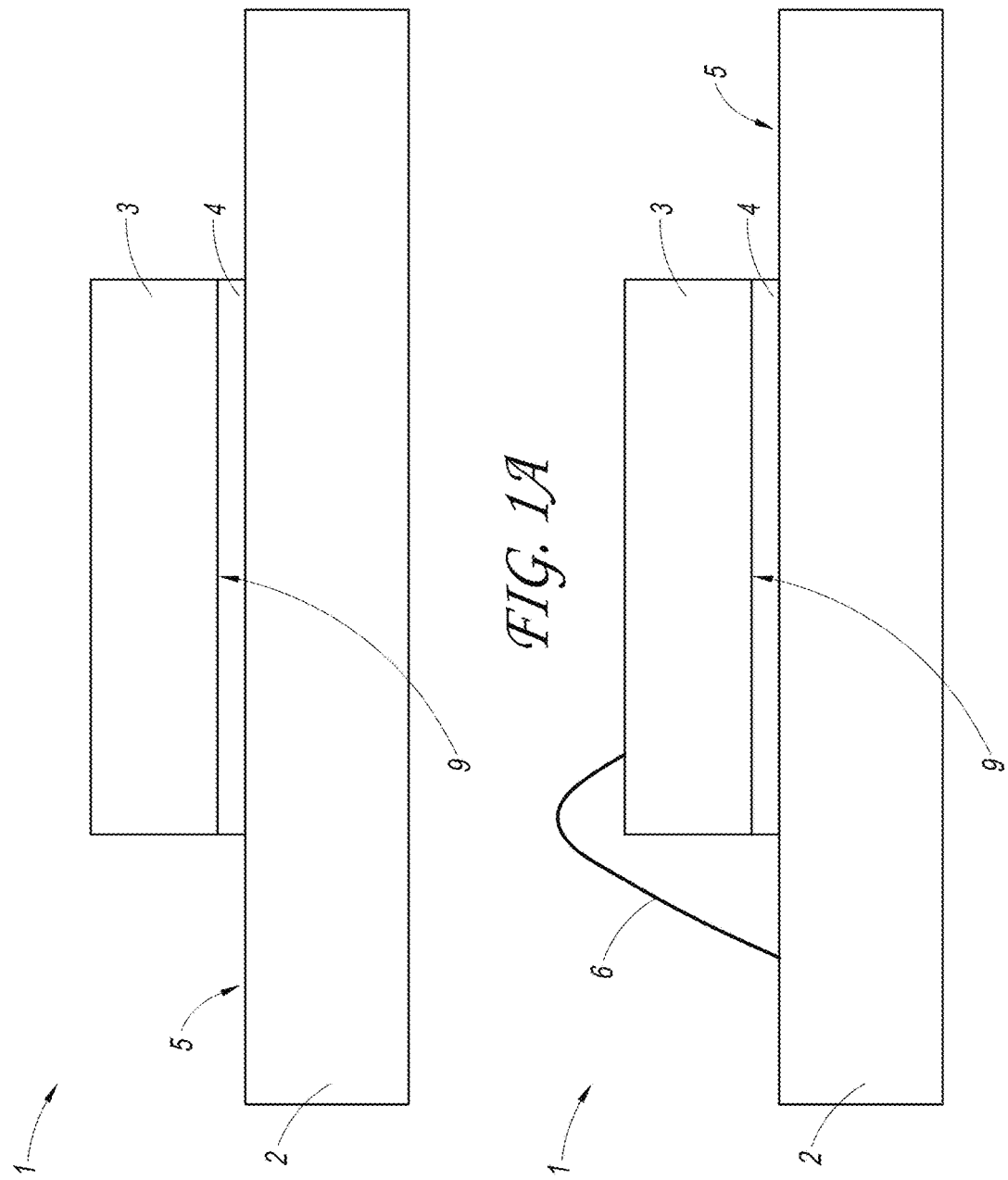

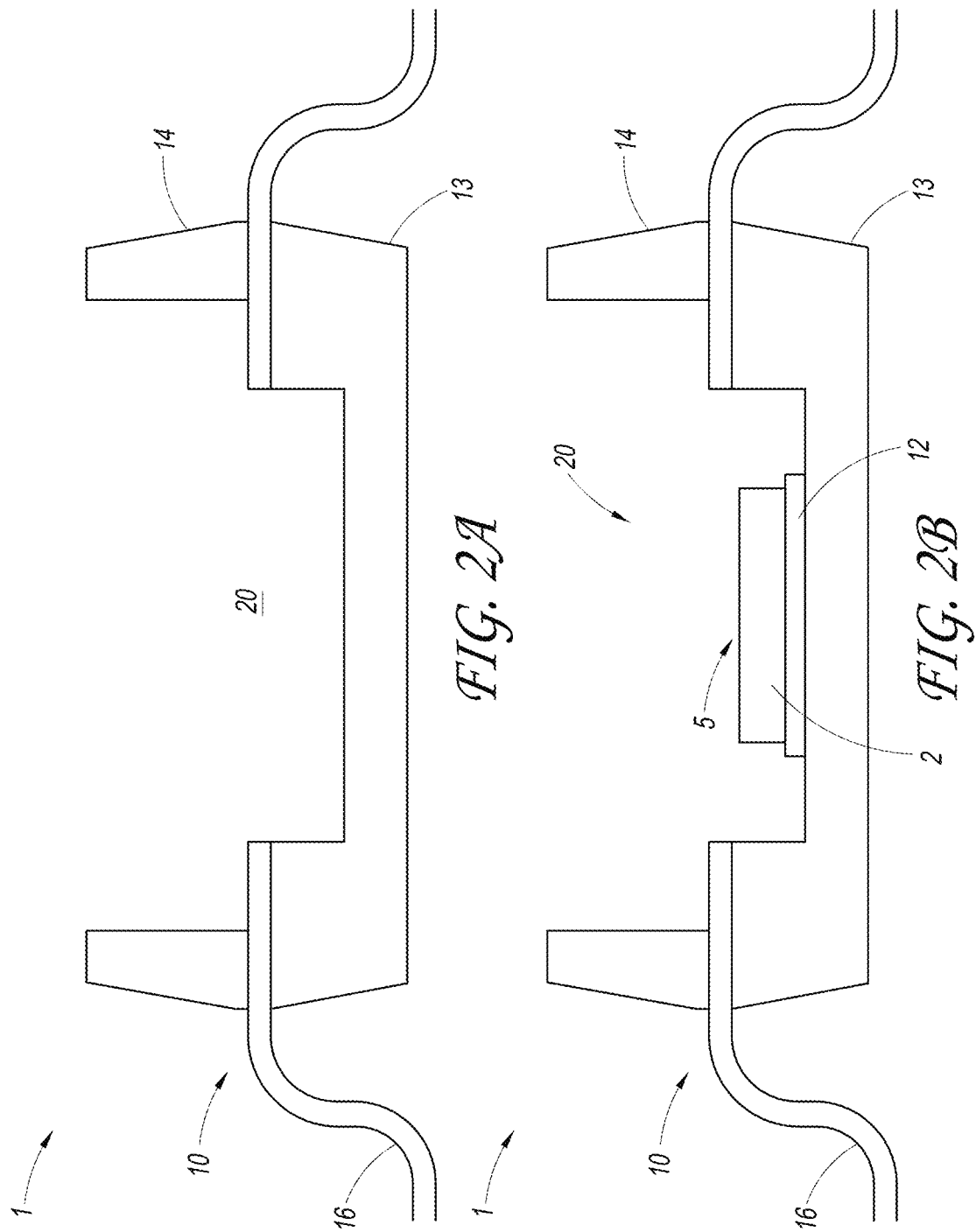

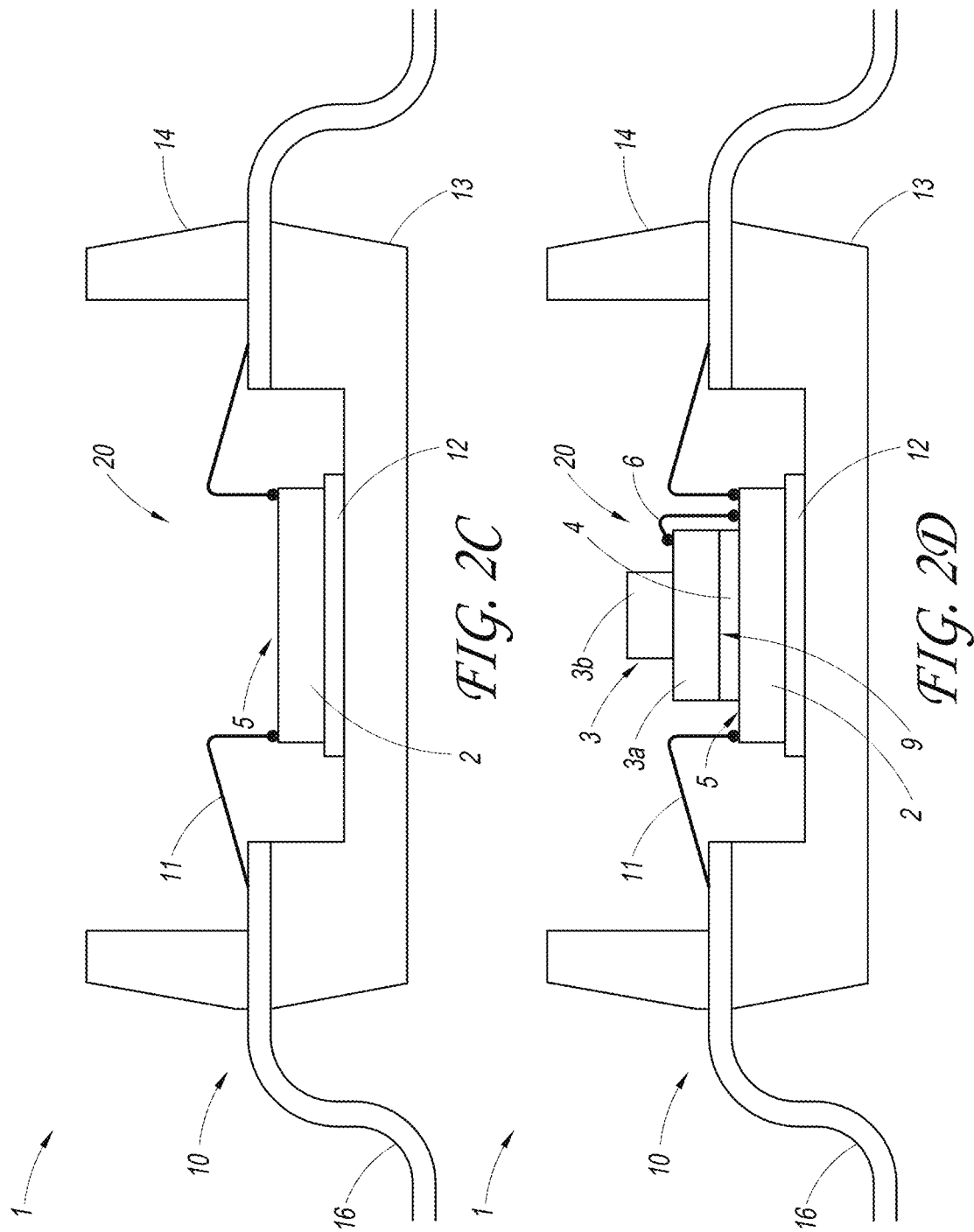

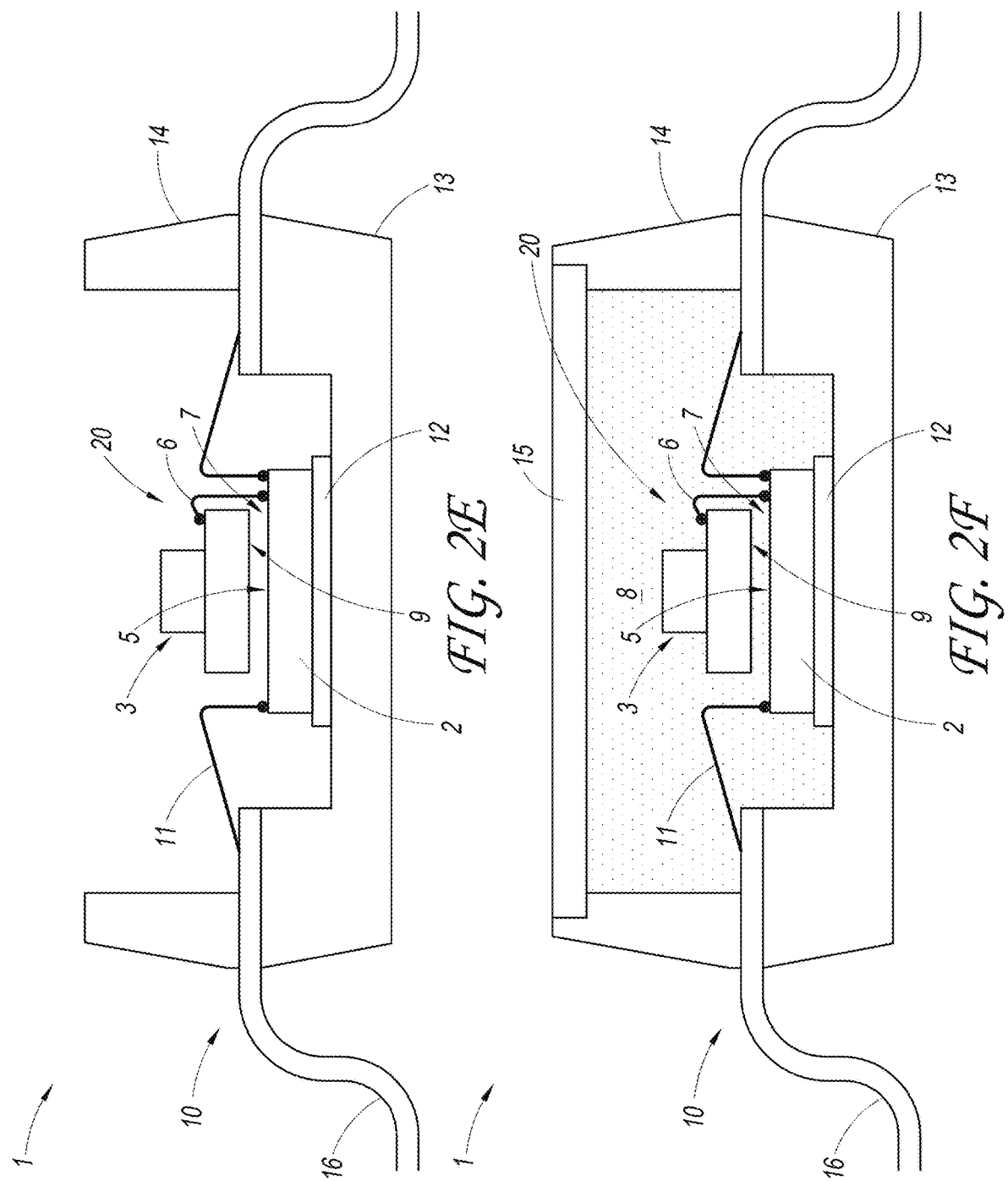

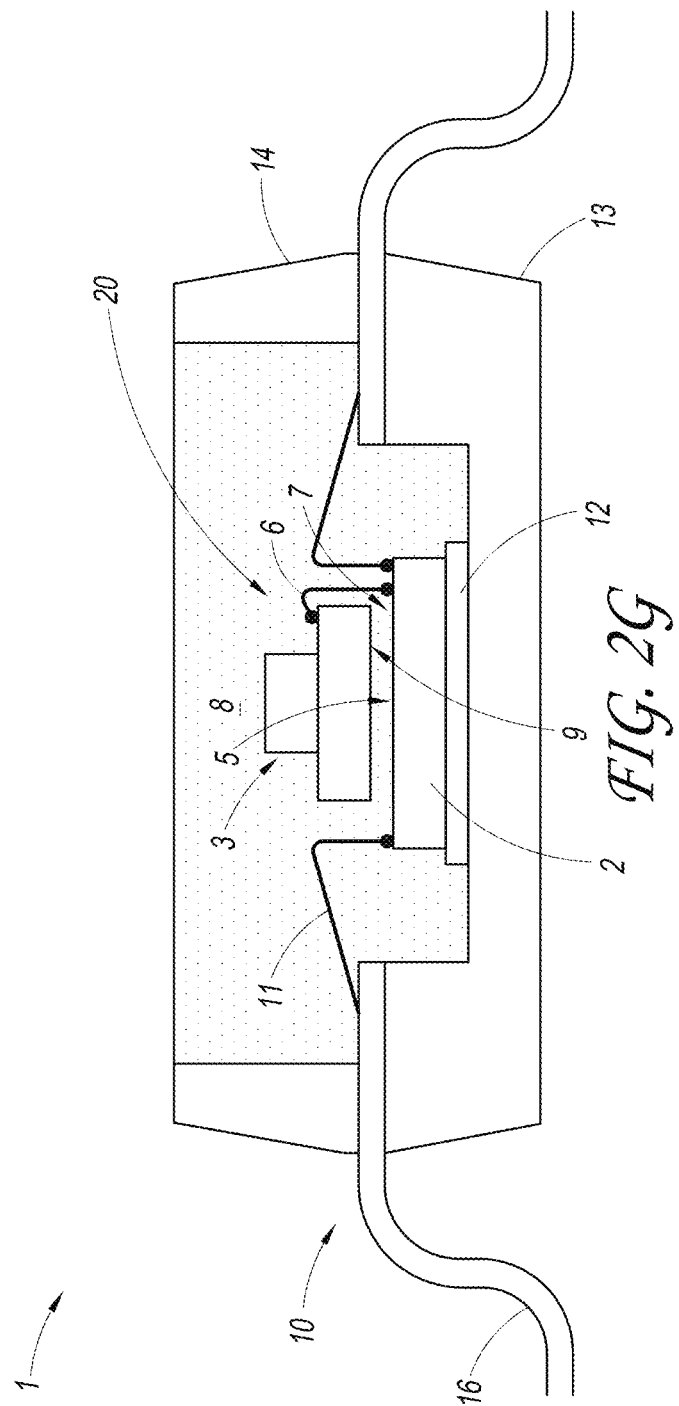

LOW STRESS INTEGRATED DEVICE PACKAGES

CROSS-REFERENCE TO RELATED APPLICATIONS

This application claims priority to U.S. Provisional Patent Application No. 62/332,950, filed May 6, 2016, the entire contents of which are hereby incorporated by reference herein in their entirety and for all purposes.

BACKGROUND

Field

The field relates generally to low stress integrated device packages and methods for manufacturing low stress integrated device packages.

Description of the Related Art

Microelectromechanical systems (MEMS) devices often include movable components which are sensitive to external forces, disturbances, and/or environmental contaminants. For example, MEMS motion sensor devices (such as gyroscopes, accelerometers, etc.) may include movable beams that are so sensitive to such external forces that packaging the MEMS devices for integration into the larger electrical or electronic system can be challenging. Accordingly, there remains a continuing need for improved low stress packaging techniques for integrated device packages such as MEMS packages.

SUMMARY

In one embodiment, an integrated device package is disclosed. The package can include a packaging structure defining a cavity. The package can include an integrated device die disposed at least partially within the cavity. The package can include a gel within the cavity, the gel surrounding the integrated device die.

In another embodiment, an integrated device package is disclosed. The package can include a carrier and a filler material over a top surface of the carrier. The package can include an integrated device die embedded or disposed within the filler material such that at least a portion of the filler material is disposed under an entire bottom surface of the integrated device die between the bottom surface of the integrated device die and the top surface of the carrier.

In another embodiment, a method for manufacturing an integrated device package is disclosed. The method can comprise providing a carrier at least partially embedded or disposed within a low stress filler material. The method can comprise embedding or disposing an integrated device die in the filler material such that at least a portion of the filler material is disposed under an entire bottom surface of the integrated device die between the bottom surface of the integrated device die and a top surface of the carrier.

In another embodiment, an integrated device package is disclosed. The package can include a carrier and a packaging structure defining a gas cavity. The package can include an integrated device die disposed at least partially within the gas cavity, the integrated device die at least partially supported above the carrier by a bonding wire such that a gap is disposed between at least a portion of the integrated device die and the carrier.

For purposes of summarizing advantages achieved over the prior art, certain objects and advantages have been described herein. Of course, it is to be understood that not necessarily all such objects or advantages may be achieved in accordance with any particular embodiment. Thus, for example, those skilled in the art will recognize that principles taught herein may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular embodiment(s) disclosed.

BRIEF DESCRIPTION OF THE DRAWINGS

These aspects and others will be apparent from the following description of preferred embodiments and the accompanying drawings, which are meant to illustrate and not to limit the invention, wherein:

FIG. 1A is a schematic side sectional view of a partially assembled package comprising a carrier and an integrated device die temporarily attached to a top surface of the carrier by a temporary die attach material, according to one embodiment.

FIG. 1B is a schematic side sectional view of the partially assembled package of FIG. 1A after wire bonding the die to the carrier.

FIG. 2A is a schematic side sectional view of a partially assembled integrated device package comprising a housing that defines a cavity, according to another embodiment.

FIG. 2B is a schematic side sectional view of the partially assembled integrated device package of FIG. 2A after mounting a carrier comprising an integrated device die to the housing in the cavity.

FIG. 2C is a schematic side sectional view of the partially assembled integrated device package of FIG. 2B after wire bonding the carrier wire to leads of the housing.

FIG. 2D is a schematic side sectional view of the partially assembled integrated device package of FIG. 2C after mounting an integrated device die to the carrier with a temporary die attach material.

FIG. 2E is a schematic side sectional view of the partially assembled integrated device package of FIG. 2D after removing the temporary die attach material.

FIG. 2F is a schematic side sectional view of an assembled integrated device package after disposing a filler material over the integrated device die and providing a lid over the filler material and the cavity of FIG. 2E, according to various embodiments.

FIG. 2G is a schematic side sectional view of an assembled integrated device package after disposing a filler material over the integrated device die and into the cavity of FIG. 2E, according to various embodiments.

DETAILED DESCRIPTION

Figure 1C:
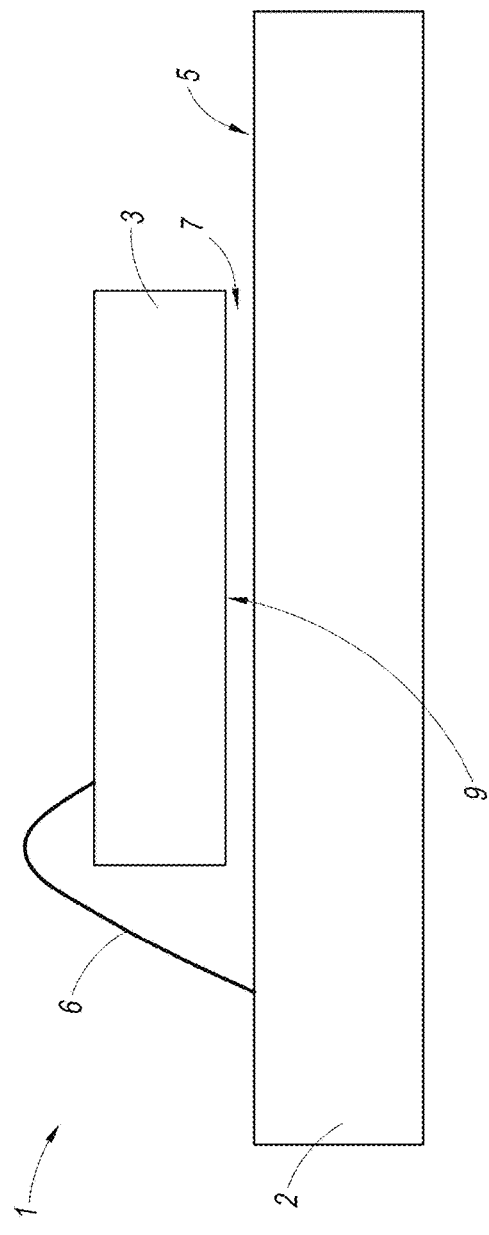
FIG. 1C is a schematic side sectional view of the partially assembled package of FIG. 1B after removing the temporary die attach material.

Various embodiments disclosed herein relate to low stress integrated device packages and methods for manufacturing low stress integrated device packages. Some integrated devices, such as some microelectromechanical systems (MEMS) devices, have components which are sensitive to external forces, disturbances, contaminants, and/or other environmental factors. For example, MEMS motion sensors (such as gyroscopes, accelerometers, etc.) can include movable mechanical components which may be damaged by other packaging components and/or by other external stresses. By way of example, in some packaging arrangements, attaching a gyroscope die to a carrier (such as a package substrate or another integrated device die) with a conventional die attach material (such as commercially available epoxy and silicone materials) may induce excessive stresses in the gyroscope die that can damage the die and/or degrade or impair its performance. Moreover, contacting the die with a conventional encapsulant or molding compound (such as dispensed or molded epoxy compounds) can also impart stresses that can damage the die and/or degrade or impair the performance of the gyroscope die.

Accordingly, various embodiments disclosed herein provide a package for sensitive device dies which protects the sensitive die from stresses, including stresses induced by external forces, other components of the package or larger electronic device, etc. In some embodiments, the package can include a carrier (such as a package substrate, another integrated device die, etc.) and a filler material disposed over a top surface of the carrier. An integrated device die can be embedded within the filler material such that at least a portion of the filler material is disposed under part of or an entire bottom surface of the integrated device die between the die and the top surface of the carrier. In various embodiments, the device die and filler material can be disposed at least partially within a cavity defined by a packaging structure (such as a housing comprising a housing body and a lid, or a flat substrate and a dam).

In some embodiments, the filler material can advantageously comprise a gel, which is different from conventional encapsulant or molding materials. For example, as compared with conventional encapsulants or molding compounds, the gel can comprise a lower stress material having, for example, a lower viscosity and/or a lower modulus of elasticity (Young's modulus). By embedding the integrated device die within the filler material or gel, the gel can advantageously absorb any external stresses to prevent the stresses from being transmitted to the integrated device die. Furthermore, since the gel is relatively soft and can flow easily in a flowable state, the gel can at least partially or entirely surround the die, including top, bottom, and side surfaces of the die. The gel can contact the die without damaging the die's sensitive components because the gel is a relatively low stress material with a low modulus of elasticity and low viscosity relative to conventional encapsulant epoxies.

FIGS. 1A-1D are schematic side views illustrating the steps of a method for manufacturing an integrated device package, according to one embodiment. FIG. 1A illustrates a partially assembled package 1 comprising a carrier 2 and an integrated device die 3 temporarily attached to a top surface 5 of the carrier 3 by a temporary die attach material 4. The carrier 2 can comprise any suitable structure or surface which is configured to support the die 3. For example, in some embodiments, the carrier 2 can comprise a package substrate, such as a printed circuit board (PCB), a molded leadframe, a ceramic substrate, a polymeric substrate, etc. In embodiments in which the carrier 2 comprises a package substrate, the carrier 2 can comprise metallic contact pads and metallic traces for routing electrical signals from the die 3 to a motherboard of the larger electrical or electronic system. In other embodiments, the carrier 2 can comprise another integrated device die. For example, in some arrangements, the carrier 2 can comprise a processor die (such as an Application Specific Integrated Circuit, or ASIC), and the integrated device die 3 can comprise a MEMS die stacked on the ASIC.

The integrated device die 3 can be stacked on the top surface 5 of the carrier 2 such that a bottom or lower surface 9 of the die 3 faces the top or upper surface 5 of the carrier 2. The integrated device die 3 can comprise any suitable type of device die, such as a MEMS die, a processor die, a memory die, etc. In some embodiments, the integrated device die 3 can comprise a motion sensor die, such as a MEMS gyroscope die or a MEMS accelerometer die. In such embodiments, the movable components of the motion sensor die may be damaged if a conventional die attach material (such as commercially available epoxy and silicone materials) is used to attach the die 3 to the carrier 2. For example, the use of conventional permanent die attach materials can transmit stresses from the carrier 2 to the die 3 in the final product. Moreover, in packages in which a conventional encapsulant or molding material is applied over the die 3, the encapsulant or molding material can impart stresses that can affect the performance of the motion sensor. For example, if the encapsulant contains moisture and/or if the encapsulant is exposed to high temperatures, the encapsulant may expand and press against the integrated device die 3, which may alter the performance of the die 3 and/or its sensitive components. It should be appreciated that the die 3 can include other types of sensitive device dies, such as processor dies (e.g., processor dies with sensitive circuitry such as bandgap reference circuitry), memory dies, other types of MEMS dies, etc.

In the embodiment shown in FIG. 1A, instead of using a permanent die attach material, a temporary die attach material 4 is used to attach the die 3 to the upper surface 5 of the carrier 2. For example, in some embodiments, the temporary die attach material 4 can comprise a wax-like adhesive that can temporarily affix the die 3 to the carrier 2. For example, the temporary die attach material 4 can be applied to the lower surface 9 of the die 3, and the die 3 can be attached to the upper surface 5 of the carrier 2. In other arrangements, the temporary die attach material 4 can be applied to the upper surface 5 of the carrier 2 and the die 3 subsequently attached. The temporary die attach material 4 can be applied (e.g., screen printed) at the wafer level (before singulation of the wafer into multiple device dies), or can be applied at the die level (after singulation). In some embodiments, the temporary die attach material 4 can comprise a water soluble thermoplastic material that can be applied to the die 3 and/or the carrier 2. For example, the temporary die attach material 4 can comprise an AquaBond™ series adhesive sold by AquaBond LLC of Long Beach, California. The thickness of the temporary die attach material 4 can be any suitable thickness. For example, in some embodiments, the temporary die attach material 4 can have a thickness in a range of 25 microns to 2 mm, or 50 microns to 2 mm, or more particularly, in a range of 40 microns to 500 microns, or in a range of 50 microns to 500 microns, which may also represent the vertical spacing between the die 3 and the carrier 2 while the die 3 is temporarily adhered to the carrier 2.

Turning to FIG. 1B, the die 3 can be electrically connected to the carrier 2. For example, as shown in FIG. 1B, the die 3 can be wire bonded to the carrier using one or more bonding wires 6. One end of the bonding wire(s) 6 can be connected (e.g., by a thermocompression bond) to a contact pad on an upper surface of the die. The other end of the bonding wire(s) 6 can be connected to a corresponding contact pad on the upper surface 5 of the carrier 5. For example, in embodiments in which the carrier 2 comprises a package substrate, the bonding wire 6 can electrically connect to a contact pad on a PCB substrate which in turn electrically communicates with leads on a bottom surface of the substrate. Alternatively, if the carrier 2 comprises a leadframe substrate, the bonding wire 6 can electrically connect to a conductive lead finger of the leadframe. In other embodiments in which the carrier 2 comprises another integrated device die (such as a processor die), the bonding wire 6 can connect to a corresponding contact or bonding pad on the upper surface 5 of the die to electrically communicate with the other die. Although bonding wire(s) 6 are illustrated in FIG. 1B, the die 3 may be connected to the carrier 2 using other types of electrical interconnects.

The temporary die attach material 4 shown in FIG. 1B can advantageously affix the die 3 relative to the carrier 2 sufficiently to withstand the wirebonding or other electrical connection process, such that the bonding wire(s) 6 can be accurately and reliably connected to the corresponding contact pads of the die 3 and the carrier 2. For example, the connection of the bonding wire(s) 6 to the die 3 and the carrier 2 may involve a significant amount of vibration (e.g., ultrasonic vibrations) and/or applied heat and pressure. The temporary die attach material 4 can temporarily secure the die 3 relative to the carrier in a lateral direction parallel to the upper surface 5 of the carrier 2 so as to provide a stable platform to which the bonding wire(s) 6 can be connected.

In FIG. 1C, the temporary die attach material 4 of FIG. 1B can be removed from the between the die 3 and the carrier 2 to define a space 7 between the die 3 and the carrier 2. In some embodiments, the temporary die attach material 4 can be removed by way of a fluid solvent, such as water mixed with a surfactant or other suitable material. In some embodiments, heat can be applied to the partially-fabricated package 1 to remove (or assist in removing) the temporary die attach material 4. For example, the fluid (e.g., water) used to dissolve the temporary die attach material 4 can be slightly heated to facilitate removal. Once the temporary die attach material 4 is removed, the die 3 may be suspended above the upper surface 5 of the carrier 2 by the bonding wire(s) 6 such that the upper surface 5 of the carrier is separated from the lower surface 9 of the die 3 by the space 7. After removal of the temporary die attach material 4, in some arrangements, gravity may cause the die 3 to sag closer to the carrier 2 such that the space 7 is in a range of 10 microns to 100 microns, in a range of 10 microns to 75 microns, or more particularly, in a range of 25 microns to 75 microns, or more particularly, in a range of 25 microns to 50 microns. Thus, after removal of the die attach material 4, the bonding wire(s) 6 can support and suspend the die 3 above the carrier 2 by the space 7, which may comprise an air gap. The space 7 need not be uniform under the die 3, and if the bond wires 6 are asymmetrical the die may be at angle (e.g., 3-15°) with respect to the upper surface 5 of the carrier 2. In some embodiments, the die 3 can sag such that a portion of the die 3 (such as a corner or edge) contacts the carrier 2, while in other embodiments, the entire die 3 is spaced from the carrier 2.

Although a temporary die attach material 4 is used in FIG. 1B to temporarily affix the die 3 relative to the carrier 2, in other embodiments, such a temporary die attach material may not be used. Rather, in other embodiments, a mechanical device such as a clamp, a robotic end effector, or any other suitable mechanism, can be used to suspend or hold the die 3 above the upper surface 5 of the carrier 2 before, during, and/or after wire bonding. In such an arrangement, the mechanical device may also support the die 3 while the bonding wires are connected to the die 3 and carrier 2.

Figure 1D:
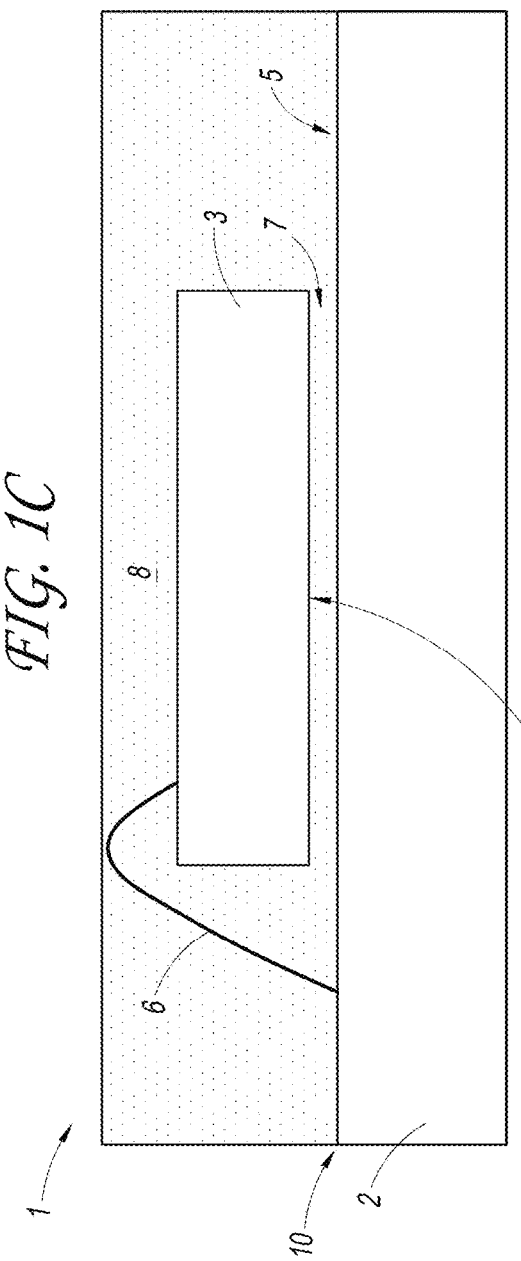
FIG. 1D is a schematic side sectional view of an assembled package after applying a filler material over the die of FIG. 1C.

Turning to FIG. 1D, a filler material 8 is flowed around the die 3 and over the upper surface 5 of the carrier 2 such that the die 3 is embedded in the filler material 8. At least the filler material 8 and the carrier 2 can define a package structure or housing 10. As shown in FIG. 1D, the die 3 and the bonding wire(s) 6 can be completely embedded in the filler material 8. As explained above, the filler material 8 can comprise a gel that has material properties significantly different from those used in conventional encapsulants or molding compounds. For example, the filler material 8 can comprise a gel that is a low stress material having, for example, a lower viscosity and/or a lower modulus of elasticity (Young's modulus) as compared with encapsulants or molding compounds. By way of example, the gel can comprise silicone, such as HIPEC® 1-4101, manufactured by Dow Corning Corporation of Midland, Mich. Prior to curing, the gel can have a viscosity in a range of 50 cps to 900 cps, in a range of 100 cps to 900 cps, in a range of 600 cps to 850 cps at 25° C., in a range of 650 cps to 800 cps at 25° C., or more particularly in a range of 675 cps to 800 cps at 25° C., or in a range of 675 cps to 775 cps 25° C. (e.g., about 700 cps, about 750 cps at 25° C.). After curing, the cured gel can have a modulus of elasticity (Young's modulus) in a range of 20 Pa to 500 Pa, in a range of 50 Pa to 500 Pa, in a range of 100 Pa to 400 Pa, more particularly in a range of 150 Pa to 350 Pa, or in a range of 200 Pa to 300 Pa (e.g., about 286 Pa in some embodiments). The gel can have a specific gravity in a range of 0.9 to 0.99, e.g., about 0.97. In other embodiments, however, the filler material can comprise an encapsulant or molding compound. In still other embodiments, the filler material 8 can comprise a gas such as air.

The filler material 8 can be applied in a flowable state, in which the filler material 8 is supplied around the die 3, and can be converted to a cured state, in which the filler material 8 is cured to be harder than in the flowable state. In the flowable state, the filler material 8 (e.g., a gel as described above) can flow around all sides of the die 3 such that the die 3 is embedded in the filler material 8. For example, the filler material 8 can be disposed about the upper and lower surfaces of the die, as well as about side surfaces of the die 3, e.g., the filler material 8 covers all exterior surfaces of the die 3 apart from the electrical connections (e.g., die bond pads to which the bond wires 6 are attached). As shown in FIG. 1D, a portion of the filler material 8 can be disposed in the space 7 between the lower surface 9 of the die 3 and the upper surface 5 of the carrier 2. In some embodiments, the filler material 8 covers and is disposed under the entire lower surface 9 of the die 3. The upper surface 5 of the carrier 2 underlies the entire lower surface 9 of the die 3 with an intervening space 7 filled with the filler material 8. In some embodiments, the die 3 does not directly contact the carrier 2. In some embodiments in which the die 3 is asymmetrically supported and sags to contact the carrier 2, as explained above, the corner or edge of the die 3 can contact the carrier 2. In such embodiments, the filler material 8 may still underlie the entire lower surface 9 of the die 3, as only a corner or edge of the die 3 makes contact with the carrier 2. Even if a portion of the die were to touch the carrier, the absence of hard adhesive materials between the lower surface 9 of the die 3 and the upper surface of the carrier 2 can prevent stresses from being imparted.

In some embodiments, the filler material 8 can be cured to change the filler material 8 from the flowable state to the cured state. For example, the filler material 8 can be heated at a temperature in a range of 100° C. to 300° C., or in a range of 100° C. to 200° C. to cure the filler material 8. As one example, the filler material 8 can be cured at 150° C. for an hour. The filler material 8 can directly contact the die 3 (such as the exterior surfaces, for example, the bottom surface) in some arrangements. In other arrangements, intervening layers, plates, or elements may be disposed between the filler material 8 and the die 3. Because the filler material 8 is relatively soft and of relatively low viscosity compared to conventional encapsulants and underfill materials (even in the cured state), the filler material 8 can absorb external stresses generated by external components and/or other components of the package or system, and can prevent or reduce stresses from being imparted to the die 3. The filler material 8 can thereby protect sensitive components of the die 3 and can advantageously maintain consistent performance of the die 3 in the presence of external stresses and forces. For example, because the filler material 8 can be disposed between the die 3 and the carrier 2 (instead of having a permanent die attach material), the transmission of stresses from the carrier 2 to the die 3 can be reduced or eliminated. Moreover, the filler material 8 can take the place of molding compounds or encapsulants, which may undesirably impose stresses on the die. Thus, the filler material 8 may be soft enough so as to protect the die 3 from external stresses, but may be hard enough to provide sufficient structure to secure the die 3 in place relative to the carrier 2 and/or to the package housing 10 in use.

FIGS. 2A-2F are schematic side cross-sectional views illustrating the steps of a method for manufacturing an integrated device package comprising multiple integrated device dies on a leadframe substrate, according to another embodiment. Unless otherwise noted, the components, materials, and functionality described above in connection with FIGS. 1A-1D may be used interchangeably with the embodiment described herein in relation to FIGS. 2A-2F. Reference numerals used in conjunction with FIGS. 2A-2F may represent the same or generally similar components as those of FIGS. 1A-1D, unless otherwise noted.

In FIG. 2A, a partially-assembled package 1 can comprise a housing 10 comprising a housing body 13 having a wall 14 extending therefrom. The housing 10 can define a cavity 20, which may comprise a recessed air cavity bounded by the housing body 13, e.g., the bottom floor of the body 13 and the wall 14. In other embodiments, the cavity can be defined by a planar packaging substrate having a dam on its upper surface to confine subsequently applied filler material. The housing body 13 can comprise a package substrate. In the embodiment of FIG. 2A, for example, the housing body 13 comprises a molded leadframe substrate, which includes a conductive leadframe embedded in a molding material or molding compound. The conductive leadframe can include a plurality of conductive leads 16, a portion of which are exposed outside the package 1. In the illustrated embodiment, the leads 16 extend outwardly from the housing body 13. In other embodiments, the leads 16 may be exposed on a bottom surface of the body 13. The leads 16 can provide electrical communication between the package 1 (including integrated device dies in the package 1) and the larger electrical system (e.g., by way of a motherboard). In other embodiments the package substrate can comprise any other suitable type of substrate, such as a PCB, a ceramic substrate, a polymeric substrate, etc.

Turning to FIG. 2B, a carrier 2 is mounted to the housing body 13 of the housing 10. As shown in FIG. 2B, the carrier 2 can be attached to the floor of the housing body 13 or a die paddle by way of an adhesive 12, which may comprise a conventional die attach material. In the illustrated embodiment, the adhesive 12 may not comprise a temporary die attach material, i.e., a die attach material configured to be removed during the package assembly process. The die attach material may comprise an epoxy or a silicone material in various embodiments. In the embodiment of FIG. 2B, the carrier 2 comprises an integrated device die, e.g., a processor die such as Application Specific Integrated Circuit, or ASIC. In other embodiments, as explained above, the carrier 2 may comprise any other type of integrated device die or may comprise a package substrate or interposer. In the illustrated embodiment, active components (e.g., active integrated circuitry) may be disposed at or near an upper surface 5 of the carrier 2. In other embodiments, the active components may be disposed at or near the bottom surface of the carrier 2 (for example, in arrangements in which the carrier 2 is flip chip mounted to the body 13).

In FIG. 2C, the carrier 2 (e.g., an integrated device die such as an ASIC or other type of processor) can be electrically connected to the package housing 10. For example, as shown in FIG. 2C, one or more carrier bonding wires 11 may electrically connect contact pads exposed at the upper surface 5 of the carrier 2 with corresponding leads 16 of the housing 10. In other embodiments, the carrier 2 can be flip chip mounted to the floor of the housing body 13, e.g., a plurality of solder balls can connect contact or bond pads on the lower surface of the carrier 2 with corresponding contacts on the floor of the housing or with the leads (if the leads were instead disposed in the floor of the body 13). In still other embodiments, one or more through-silicon vias (TSVs) can extend through the carrier to provide electrical communication between the carrier 2 and the housing.

Turning to FIG. 2D, an integrated device die 3 can be temporarily adhered to the upper surface 5 of the carrier 2 by way of a temporary die attach material 4. The integrated device die 3 can comprise any suitable type of die, such as a MEMS die, a processor die, a memory die, etc. In the illustrated embodiment, the die 3 comprises a MEMS motion sensor die, such as an accelerometer or a gyroscope. The die 3 can include a device portion 3a and a cap 3b which covers at least part of the device portion 3a. An active, moveable device (such as a movable mechanical beam or element) may be formed or defined in the device portion 3a, e.g., at or near the upper surface of the device portion 3a. The movable beam or element may comprise a component in a gyroscope or accelerometer device. In such devices, the movable beam or element may be very sensitive. The cap 3b can cover the movable beam or element to provide protection to the movable MEMS element.

As with the embodiment of FIGS. 1A-1B, instead of using a permanent die attach material, the temporary die attach material 4 can be used to attach the die 3 to the upper surface 5 of the carrier 2. For example, as explained above, the temporary die attach material 4 can comprise a wax-like adhesive that can temporarily affix the die 3 to the carrier 2. For example, the temporary die attach material 4 can be applied to a lower surface 9 of the die 3, and the die 3 can be attached to the upper surface 5 of the carrier 2. In other arrangements, the temporary die attach material 4 can be applied to the upper surface 5 of the carrier 2. The temporary die attach material 4 can be applied (e.g., screen printed) at the wafer level (before singulation of the wafer into multiple device dies), or can be applied at the die level (after singulation). In some embodiments, the temporary die attach material 4 can comprise a water soluble thermoplastic material that can be applied to the die 3 and/or the carrier 2. For example, the temporary die attach material 4 can comprise an AquaBond$^{TM}$ series adhesive sold by AquaBond LLC of Long Beach, Calif. The thickness of the temporary die attach material 4 can be any suitable thickness. For example, in some embodiments, the temporary die attach material 4 can have a thickness in a range of 25 microns to 2 mm, or in a range of 50 microns to 2 mm, or more particularly, in a range of 40 microns to 500 microns, or in a range of 50 microns to 500 microns, which may also represent the vertical spacing between the die 3 and the carrier 2 while the die 3 is temporarily adhered to the carrier 2.

Moreover, as shown in FIG. 2D, the die 3, and particularly bond pads in the device portion 3a, can be electrically connected to corresponding contact pads on the carrier 2. For example, as with FIG. 1C, one or more bonding wires 6 can extend from a contact pad on the die 3 to another contact pad on the carrier 2. In the embodiment of FIG. 2D, in which the die 3 comprises a MEMS motion sensor die and the carrier 2 comprises a processor die, the carrier 2 can receive signals transduced by the die 3 and can pre-process those signals before transmission to the larger electronic system by way of the leads 16. For example, the carrier 2 (e.g., a processor die) can comprise active circuitry which converts the analog signals transduced by the die 3 into digital signals, provides signal conditioning functions, and/or performs various other processes received from (and/or transmitted to) the die 3. In other embodiments, the die 3 can be electrically connected (e.g., wire bonded) to corresponding conductive lands or leads 16 on the package housing 10, which may be different from the leads 16 to which the carrier 2 connects.

As explained above with respect to FIG. 1B, the temporary die attach material 4 shown in FIG. 2D can advantageously affix the die 3 relative to the carrier 2 sufficiently for wirebonding, such that the bonding wire(s) 6 to be accurately and reliably connected to the corresponding contact pads of the die 3 and the carrier 2. For example, the connection of the bonding wire(s) 6 to the die 3 and the carrier 2 may involve a significant amount of vibration (e.g., ultrasonic vibrations) and/or applied heat and pressure. The temporary die attach material 4 can temporarily secure the die 3 relative to the carrier in a lateral direction parallel to the upper surface 5 of the carrier 2 so as to provide a stable platform to which the bonding wire(s) 6 can be connected.

In FIG. 2E, the temporary die attach material 4 is removed to define a space 7 between the die 3 and the carrier 2. In some embodiments, the temporary die attach material 4 can be removed by way of a fluid solvent, such as water mixed with a surfactant or other suitable material. In some embodiments, heat can be applied to the partially-fabricated package 1 and/or to the fluid to remove (or assist in removing) the temporary die attach material 4. Once the temporary die attach material 4 is removed, the die 3 may be suspended above the upper surface 5 of the carrier 2 by the bonding wire(s) 6 such that the upper surface 5 of the carrier is separated from the lower surface 9 of the die 3 by the space 7. After removal of the temporary die attach material 4, in some arrangements, gravity may cause the die 3 to sag closer to the carrier 2 such that the space 7 is in a range of 10 microns to 100 microns, in a range of 10 microns to 75 microns, or more particularly, in a range of 25 microns to 75 microns, or more particularly, in a range of 25 microns to 50 microns. Thus, after removal of the die attach material 4, the bonding wire(s) 6 can support and suspend the die 3 above the carrier 2 by the space 7, which may comprise an air gap at this stage of processing.

Although a temporary die attach material 4 is used in FIG. 2D to temporarily affix the die 3 relative to the carrier 2, in other embodiments, such a temporary die attach material may not be used. Rather, in other embodiments, a mechanical device such as a clamp, a robotic end effector, or any other suitable mechanism, can be used to suspend or hold the die 3 above the upper surface 5 of the carrier 2 before, during, and/or after wire bonding.

Turning to FIG. 2F, a filler material 8 is flowed over at least a portion of the upper surface 5 of the carrier, the bonding wires 6, and the integrated device die 3. The filler material 8 can comprise a low stress material, such as a gel as described above. The filler material 8 can comprise a flowable state and a cured state. In the flowable state, the filler material 8 can flow underneath the lower surface 9 of the die 3 (which can be the lower surface of the device portion 3a) such that a portion of the filler material 8 is disposed between the die 3 and the carrier 2. In the illustrated embodiment, the filler material 8 covers the entire lower surface 9 of the die 3. More particularly, in the illustrated embodiment, the entire die 3 is completely embedded in the filler material 8 such that the filler material 8 surrounds every side of the die, including the cap 3b and the device portion 3a. In the illustrated embodiment, the die 3 does not directly contact the carrier 2. In some embodiments, a portion of the die 3 may contact the carrier 2, as explained above. For example, as explained above, the corner or edge of the die 3 can contact the carrier 2. In such embodiments, the filler material 8 may still underlie the entire lower surface 9 of the die 3 because the portion of the die 3 that contacts the carrier 2 is only a corner or edge of the die 3. Even if a portion of the die 3 were to rest upon the upper surface 5 of the carrier 2, the absence of harder adhesive materials between the lower surface 9 of the die 3 and the upper surface 5 of the carrier can reduce stresses being imparted to the die 3.

In some embodiments, such as that illustrated in FIG. 2F, the filler material 8 substantially or entirely fills the cavity 20 of the package housing 10. For example, in the illustrated example, the interior components of the cavity 20, including the carrier 2, the carrier bonding wires 11, the bonding wire(s) 6, and the integrated device die 3 are embedded in the filler material 8. In other embodiments, only the integrated device die 3 is completely embedded in the filler material 8, and other components of the package 1 may remain exposed. In still other embodiments, only the integrated device die 3 and the bonding wires 6 are completely embed in the filler material 8, and other components may remain exposed. In FIG. 2F, a package lid 15 can be applied over the cavity 20 and filler material 8 and mechanically connected to the housing body 13, e.g., to the wall 14. Although the lid 15 shown in FIG. 2F is shown as a planar or flat lid, in other embodiments, the lid can comprise a shaped or curved lid. Furthermore, in some embodiments there may be an air gap between the filler material 8 and the bottom of the lid 15.

As explained above, the filler material 8 can comprise a gel that has material properties significantly different from those used in conventional encapsulants or molding compounds. For example, the filler material 8 can comprise a gel that is a low stress material having, for example, a lower viscosity and a lower modulus of elasticity (Young's modulus) as compared with encapsulants or molding compounds. By way of example, the gel can comprise silicone, such as HIPEC® 1-4101, manufactured by Dow Corning Corporation of Midland, Mich. Prior to curing, the gel can have a viscosity in a range of 50 cps to 900 cps, in a range of 100 cps to 900 cps, in a range of 600 cps to 850 cps at 25° C., in a range of 650 cps to 800 cps at 25° C., or more particularly in a range of 675 cps to 800 cps at 25° C., or in a range of 675 cps to 775 cps 25° C. (e.g., about 700 cps, about 750 cps at 25° C.). After curing, the cured gel can have a modulus of elasticity in a range of 20 Pa to 500 Pa, in a range of 50 Pa to 500 Pa, in a range of 100 Pa to 400 Pa, more particularly in a range of 150 Pa to 350 Pa, or in a range of 200 Pa to 300 Pa (e.g., about 286 Pa in some embodiments). The gel can have a specific gravity in a range of 0.9 to 0.99, e.g., about 0.97. In other embodiments, however, the filler material can comprise an encapsulant or molding compound. In still other embodiments (see FIG. 2H), the filler material 8 can comprise a gas such as air.

As with the embodiment of FIGS. 1A-1D, the filler material 8 can be cured (e.g., heated) to change the filler material 8 from the flowable state to the cured state which is less flowable than the flowable state. For example, the filler material 8 can be heated at a temperature in a range of 100° C. to 300° C., or in a range of 100° C. to 200° C. to cure the filler material 8. As one example, the filler material 8 can be cured at 150° C. for an hour. The filler material 8 can directly contact the die 3 (such as the exterior surfaces, for example, the bottom surface) in some arrangements. In other arrangements, intervening layers, plates, or elements may be disposed between the filler material 8 and the die 3. Because the cured filler material 8 in the final product is relatively soft and of low viscosity relative to conventional encapsulants or underfill materials, the filler material 8 can absorb external stresses generated by external components and/or other components of the package or system, and can prevent or reduce stresses from being imparted to the die 3. The filler material 8 can thereby protect sensitive components of the die 3 (e.g., movable MEMS components formed in the device portion 3a) and can advantageously maintain the performance of the die 3 in the presence of external stresses and forces. For example, because the filler material 8 can be disposed between the die 3 and the carrier 2 (in the absence of a permanent die attach material at that location), the transmission of stresses from the carrier 2 to the die 3 can be reduced or eliminated. Moreover, the filler material 8 can take the place of molding compounds or encapsulants, which may undesirably impose stresses on the die. Thus, the filler material 8 may be soft enough so as to protect the die 3 from external stresses, but may be hard enough to provide sufficient structure to secure the die 3 in place relative to the carrier 2 and/or to the package housing 10 generally.

FIG. 2G illustrates another embodiment in which like reference numbers refer to similar features as prior embodiments. In the embodiment of FIG. 2G, the cavity 20 is defined by a planar substrate 13 and a dam 14, but is otherwise similar to the embodiment of FIG. 2F. For example, in the embodiment of FIG. 2G, there may be no cover or lid which covers the cavity 20. In some embodiments, the die 3 does not directly contact the carrier 3 and is rather suspended above it. In some embodiments, a portion of the die 3 may contact the carrier 2, as explained above. For example, as explained above, the corner or edge of the die 3 can contact the carrier 2. In such embodiments, the filler material 8 may still underlie the entire lower surface 9 of the die 3 because the portion of the die 3 that contacts the carrier 2 is only a corner or edge of the die 3.

Figure 2H:
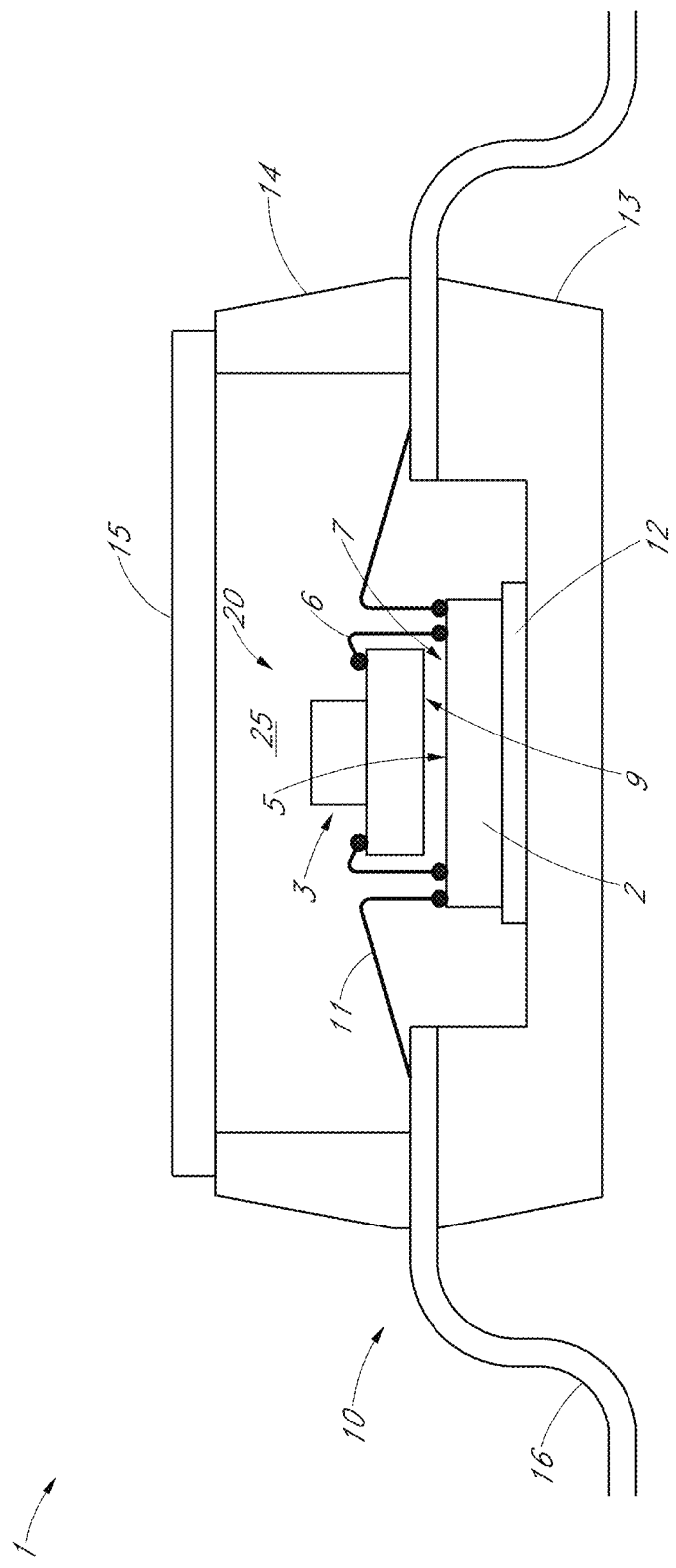
FIG. 2H is a schematic side cross-section view of an assembled integrated device package after mounting a lid on the cavity walls of FIG. 2E, according to another embodiment.

FIG. 2H is a schematic side cross-sectional view of an integrated device package 1 comprising a package housing 10 defining a gas cavity 25 (e.g., an air cavity) in which the die 3 and carrier 2 are disposed. Unless otherwise noted, reference numerals in FIG. 2H refer to similar features as prior embodiments. For example, as explained above with respect to the process of forming up to FIG. 2E, the die 3 can be suspended above the carrier 2 by the bonding wires 6 such that a space 7 in the form of a gap is provided between the die 3 and the carrier 2, as explained above. As shown in FIG. 2H, bonding wires 6 can be provided on opposing sides of the die 3 so as to provide improved support to the die 3. The bonding wires 6 can act like springs to support and suspend the die 3 above the carrier 2. Unlike the embodiments of FIGS. 2F and 2G, in the embodiment of FIG. 2H, the filler material may comprise a gas 25 such as air. As with the embodiments above in which the filler material comprises a gel, in the embodiment of FIG. 2H, the gas 25 can surround the die 3, including within the space 7 or gap between the die 3 and carrier 2. (n the embodiment of FIG. 2H, a lid 15 can be mechanically coupled to the wall 14 of the package housing 10 to define the gas cavity 25 (which may comprise a gas such as air or inert gas). Thus, in the embodiment of FIG. 2H, the die 3 is suspended or supported in the "air" cavity 25 over the carrier 2 by way of the bonding wires 6, such that the space 7 between the die 3 and carrier 2 comprises an air gap, although the gap may be filled with gases other than air. The suspension of the die may comprise a flexible (or non-rigid) mechanical connection with the carrier 2, which may serve to isolate or reduce the transmission of stresses to the die 3. In the illustrated embodiment, with supporting bond wires 6 on opposing sides, the die 3 does not directly contact the carrier 3 and is rather suspended above it. The skilled artisan will appreciate that in view of the discussion of FIG. 1C that, in other embodiments, the bond wires may not be formed on opposing sides, or may be formed asymmetrically, such that the die may be angled with respect to the carrier and may contact the carrier on one side. In such embodiments, the filler material 8 may still underlie the entire lower surface 9 of the die 3 because the portion of the die 3 that contacts the carrier 2 is only a corner or edge of the die 3.

Figure 3:
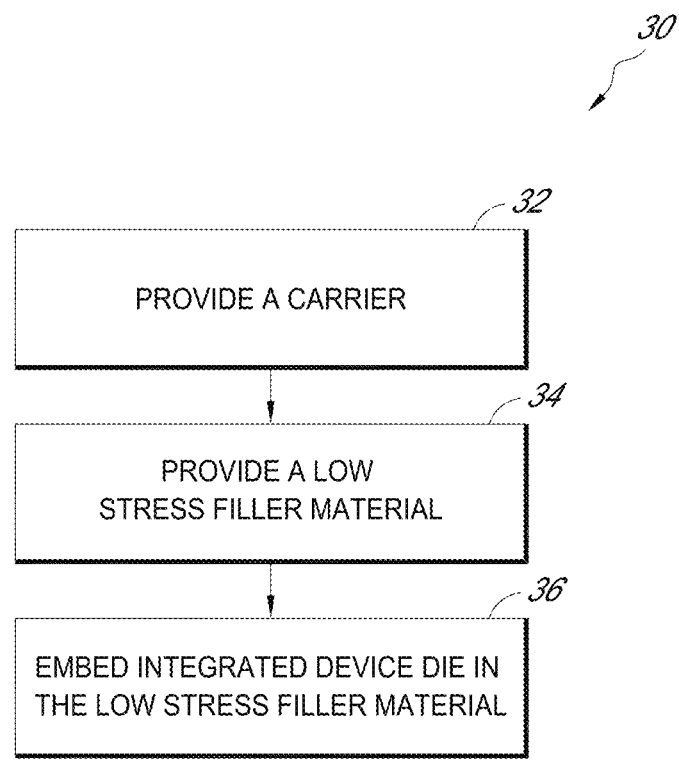
FIG. 3 is a flowchart illustrating an exemplary method for manufacturing an integrated device package, according to various embodiments.

FIG. 3 is a flowchart illustrating an exemplary method 30 for manufacturing an integrated device package, according to various embodiments. The method 30 begins in a block 32 to provide a carrier. The carrier can comprise any suitable structure or surface which is sized and configured to support an integrated device die. For example, the carrier can comprise a package substrate, such as a PCB, a molded leadframe, a ceramic substrate, a polymer substrate, etc. The carrier can also comprise an integrated device die, such as a processor die (e.g., an ASIC), a MEMS die, a memory die, etc. The carrier can comprise contact or bonding pads to provide electrical communication with an integrated device die to be stacked on the carrier, directly or by way of package leads or traces, and with the larger electronic system or device.

The method 30 moves to a block 34 in which a low stress filler material is provided. The low stress filler material can comprise a gel, such as silicone, which is a lower stress material as compared with conventional encapsulants or molding compounds. In some embodiments, the gel can comprise other materials such as an ionic conductive gel. The gel described above in connection with the embodiments of FIGS. 1A-2F may be used. In other embodiments, the filler material can comprise an encapsulant or molding compound. In some embodiments, the filler material can have a flowable state in which the filler material flows into a cavity or other portion of a package housing. The filler material can be cured to a cured state which is less flowable (or harder) than the flowable state. In the illustrated method, the low stress filler material can be provided to protect the die from external stresses and/or to support the die in moving or vibrating environments. As explained above, the filler material can comprise a gas such as air or inert gas(es) in various embodiments.

In a block 34, an integrated device die can be embedded in the filler material. As explained above, the integrated device die can be temporarily adhered to an upper surface of the carrier using a temporary die attach material, such as a wax-like thermoplastic material. The integrated device die can comprise any suitable type of die, such as a processor die, a MEMS die (such as a motion sensor die), a memory die, etc. The integrated device die can be electrically connected to the carrier, for example, with one or more bonding wires. For example, a first end of a bonding wire can be connected to the top surface of the carrier and a second end of the bonding wire can be connected to a top surface of the integrated device die. The temporary die attach material can provide temporary support for the die during wire bonding. After wire bonding, the temporary die attach material can be removed, for example, by using a solvent (e.g., water with a surfactant) and/or by application of heat. The wire bonds can suspend the die above the carrier by a space which separates the bottom surface of the die from the upper surface of the carrier.

The filler material can be applied around the die in the flowable state to surround the die such that the die is embedded in the filler material. As explained above, the filler material can be disposed under an entire bottom surface of the integrated device die between the bottom surface of the die and a top surface of the carrier, and in any event there is no separate adhesive between the bottom of the die and the top of the carrier. In various embodiments, the die can be entirely embedded in the filler material. In some embodiments, the bonding wires and part or all of the carrier may also be embedded in the filler material. The filler material can be cured to cause the filler material to be less flowable.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An integrated device package comprising:
   a packaging structure defining a cavity, the packaging structure having a bottom floor and a wall, the cavity bounded at least in part by the bottom floor and the wall;
   a first integrated device die disposed at least partially within the cavity, the first integrated device die having no die attach material on a lower surface thereof;
   a gel within the cavity, the gel surrounding the first integrated device die;
   a second integrated device die mounted to the bottom floor of the packaging structure by way of an adhesive and at least partially disposed in the cavity, the second integrated device die disposed under the first integrated device die; and
   a bonding wire that electrically connects and extends between a top surface of the first integrated device die and an upper surface of the second integrated device die,
   wherein a portion of the gel is disposed between the lower surface of the first integrated device die and the upper surface of the second integrated device die.

2. The integrated device package of claim 1, wherein the gel comprises silicone.

3. The integrated device package of claim 1, wherein prior to curing the gel has a viscosity in a range of 50 cps to 900 cps at 25° C.

4. The integrated device package of claim 1, wherein the gel has a Young's modulus in a range of 20 Pa to 500 Pa.

5. The integrated device package of claim 1, wherein the gel directly contacts the lower surface of the first integrated device die.

6. The integrated device package of claim 1, wherein the first integrated device die comprises a motion sensor die.

7. The integrated device package of claim 1, wherein the second integrated device die comprises a processor die.

8. The integrated device package of claim 1, wherein lower surface of the first integrated device die is spaced from the upper surface of the second integrated device die by a spacing in a range of 10 microns to 75 microns.

9. An integrated device package comprising:
   a packaging structure defining a cavity, the packaging structure having a bottom floor and a wall, the cavity bounded at least in part by the bottom floor and the wall;
   a carrier mounted to the bottom floor of the packaging structure;
   a filler material comprising a gel over a top surface of the carrier; and
   a micro electro mechanical systems (MEMS) die embedded or disposed within the filler material such that at least a portion of the filler material is disposed under an entire bottom surface of the MEMS die between the bottom surface of the MEMS die and the top surface of the carrier,
   wherein a material different from the filler material is disposed under a bottom surface of the carrier to mount the carrier to the packaging structure.

10. The integrated device package of claim 9, wherein the gel comprises silicone.

11. The integrated device package of claim 9, wherein the MEMS die comprises a motion sensor die.

12. An integrated device package comprising:
a packaging structure defining a cavity, the packaging structure having a bottom floor and an inner sidewall, the cavity bounded at least in part by the bottom floor and the wall;
a carrier mounted to the bottom floor of the packaging structure by way of an adhesive;
an integrated device die disposed within the cavity, the integrated device die having no die attach material on a lower surface thereof and disposed above the carrier, the carrier comprising a second integrated device die;
a gel within the cavity; and
a bonding wire that electrically connects and extends between a top surface of the first integrated device die and an upper surface of the second integrated device die,
wherein a portion of the gel is disposed between the lower surface of the integrated device die and the upper surface of the carrier,
wherein the inner sidewall of the packaging structure comprises a ceramic substrate, a polymeric substrate, a molded leadframe, or a printed circuit board (PCB) material in direct contact with the gel.

13. The integrated device package of claim 12, wherein the carrier comprises a processor die.

14. The integrated device package of claim 12, wherein the gel surrounds the integrated device die within the cavity.

15. The integrated device package of claim 12, wherein the integrated device die comprises a micro electro mechanical systems (MEMS) die.

16. The integrated device package of claim 1, wherein the second integrated device die is electrically connected to a lead of the packaging structure, the lead being elevated above the bottom floor of the packaging structure.

17. The integrated device package of claim 1, wherein the first integrated device die comprises a micro electro mechanical systems (MEMS) die.

18. The integrated device package of claim 9, further comprising a bonding wire, the bonding wire electrically connects and extends between a top surface of the MEMS die and the top surface of the carrier, the top surface of the MEMS die being opposite the bottom surface of the MEMS die.

19. The integrated device package of claim 9, wherein the carrier comprises a processor die.

20. The integrated device package of claim 12, wherein the gel comprises silicone.

* * * * *